United States Patent
Yang et al.

(10) Patent No.: US 9,666,459 B2
(45) Date of Patent: May 30, 2017

(54) APPARATUS FOR PROCESSING WAFERS

(71) Applicant: Samsung Electronics Co., Ltd., Suwon-Si, Gyeonggi-Do (KR)

(72) Inventors: Cheol-Kyu Yang, Suwon-si (KR); Seog-Min Lee, Suwon-si (KR); Chul-Young Jang, Hwaseong-si (KR); Dong-Min Son, Hwaseong-si (KR); Byung-Ho Ahn, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 482 days.

(21) Appl. No.: 14/193,927

(22) Filed: Feb. 28, 2014

(65) Prior Publication Data

US 2014/0261174 A1 Sep. 18, 2014

(30) Foreign Application Priority Data

Mar. 12, 2013 (KR) .................. 10-2013-0025927

(51) Int. Cl.
*H01L 21/67* (2006.01)
*C23C 16/44* (2006.01)
*C23C 16/54* (2006.01)

(52) U.S. Cl.
CPC .... *H01L 21/67109* (2013.01); *C23C 16/4405* (2013.01); *C23C 16/4408* (2013.01); *C23C 16/4409* (2013.01); *C23C 16/54* (2013.01)

(58) Field of Classification Search
CPC ........... H01L 21/67109; C23C 16/4405; C23C 16/54; C23C 16/4409; C23C 16/4408
USPC ....................................... 118/715; 156/345.1
See application file for complete search history.

(56) References Cited

U.S. PATENT DOCUMENTS

| | | | |
|---|---|---|---|
| 5,387,557 A | 2/1995 | Takagi | |
| 5,551,985 A * | 9/1996 | Brors | C23C 16/455 118/715 |
| 5,902,103 A * | 5/1999 | Maeda | C23C 16/455 432/152 |
| 6,187,102 B1 * | 2/2001 | Yamamoto | C23C 16/4401 118/725 |
| 6,464,930 B2 | 10/2002 | An et al. | |

(Continued)

FOREIGN PATENT DOCUMENTS

| | | |
|---|---|---|
| JP | 3449630 B2 | 9/2003 |
| KR | 10-0186103 B1 | 4/1999 |

(Continued)

*Primary Examiner* — Rudy Zervigon
(74) *Attorney, Agent, or Firm* — Harness, Dickey & Pierce, P.L.C.

(57) ABSTRACT

A wafer processing apparatus includes a reaction tube extending in a vertical direction, a door plate positioned under the reaction tube to seal the reaction tube. The door plate may be configured to load a boat into the reaction tube and support a plurality of wafers. The wafer processing apparatus may include a cap plate on the door plate, the cap plate including a cylindrical body. The cylindrical body may surround a lower side surface of the boat. A guiding recess may be formed in an outer surface of the cylindrical body along a circumferential direction of the cylindrical body. The wafer processing apparatus may include an exhaust portion configured to remove the first gas from the reaction tube through the guiding recess.

19 Claims, 5 Drawing Sheets

(56) References Cited

U.S. PATENT DOCUMENTS

| | | | |
|---|---|---|---|
| 7,828,898 B2* | 11/2010 | Maeda | C23C 16/45512 118/715 |
| 8,057,599 B2* | 11/2011 | Ozaki | C23C 16/4401 118/715 |
| 8,076,615 B2* | 12/2011 | Morita | C23C 16/4401 118/50.1 |
| 8,166,914 B2* | 5/2012 | Takahashi | H01J 37/32091 118/620 |
| 8,354,623 B2* | 1/2013 | Matsuura | C23C 16/4581 118/725 |
| 9,028,614 B2* | 5/2015 | Hara | C30B 25/08 118/724 |
| 9,139,933 B2* | 9/2015 | Tsumori | C30B 25/12 |
| 2003/0015138 A1* | 1/2003 | Tometsuka | C23C 16/45519 118/715 |
| 2003/0183614 A1* | 10/2003 | Yamaguchi | C30B 31/10 219/390 |
| 2003/0231698 A1* | 12/2003 | Yamaguchi | G01K 7/42 374/179 |
| 2004/0011286 A1 | 1/2004 | Kwon | |
| 2006/0150904 A1* | 7/2006 | Ozaki | C23C 16/4401 118/715 |
| 2007/0062448 A1* | 3/2007 | Maeda | C23C 16/45512 118/715 |
| 2009/0032190 A1* | 2/2009 | Takahashi | H01J 37/32091 156/345.33 |
| 2009/0088001 A1* | 4/2009 | Nakagawa | C23C 16/45523 438/778 |
| 2009/0145890 A1* | 6/2009 | Matsuura | C23C 16/4581 219/388 |
| 2012/0000425 A1* | 1/2012 | Park | C23C 16/45565 118/724 |
| 2012/0186573 A1* | 7/2012 | Jdira | H01L 21/67109 126/58 |
| 2013/0042803 A1* | 2/2013 | Saido | C23C 16/45578 117/88 |
| 2013/0327273 A1* | 12/2013 | Okada | C23C 16/4405 118/715 |
| 2014/0087565 A1* | 3/2014 | Yamaguchi | C23C 16/4401 438/758 |
| 2014/0261174 A1* | 9/2014 | Yang | H01L 21/67109 118/715 |

FOREIGN PATENT DOCUMENTS

| | | |
|---|---|---|
| KR | 10-0237822 B1 | 1/2000 |
| KR | 2000-0020461 A | 4/2000 |
| KR | 10-0533459 B1 | 12/2005 |
| KR | 2006-0026355 A | 3/2006 |
| KR | 2006-0119555 A | 11/2006 |

* cited by examiner

APPARATUS FOR PROCESSING WAFERS

PRIORITY STATEMENT

This application claims priority under 35 U.S.C. §119 to Korean Patent Application No. 10-2013-0025927, filed on Mar. 12, 2013 in the Korean Intellectual Property Office (KIPO), the contents of which are herein incorporated by reference in their entirety.

BACKGROUND

Field

At least one example embodiment relates to a wafer processing apparatus. More particularly, at least one example embodiment relates to a wafer processing apparatus for depositing a layer on wafers.

Description of the Related Art

A plurality of vertically stacked wafers may be loaded into a batch reactor and then a deposition process such as a low-pressure chemical vapor deposition (LP-CVD) process and an atomic layer deposition (ALD) process may be performed to form a layer on the wafers.

However, when the deposition processes are performed repeatedly in a batch type reaction chamber, layers may be excessively deposited on a wafer boat and a door plate in a lower portion of a reaction chamber, to thereby increase maintenance time.

SUMMARY

At least one example embodiment provides a wafer processing apparatus that includes a batch reactor and is capable of increasing production rates.

According to at least one example embodiment, a wafer processing apparatus includes a reaction tube extending in a vertical direction, a door plate positioned under the reaction tube to seal the reaction tube. The door plate may be configured to load a boat into the reaction tube and support a plurality of wafers. The wafer processing apparatus includes a cap plate on the door plate, the cap plate including a cylindrical body. The cylindrical body may surround a lower side surface of the boat. A guiding recess may be formed in an outer surface of the cylindrical body along a circumferential direction of the cylindrical body. The wafer processing apparatus includes at least one first nozzle provided in a lower portion of the reaction tube. The at least one first nozzle may be configured to supply a first gas in the reaction tube. The wafer processing apparatus includes an exhaust portion configured to remove the first gas from the reaction tube through the guiding recess.

According to at least one example embodiment, the cap plate includes a first protruding portion extending outward in a radial direction from an upper portion of the cylindrical body.

According to at least one example embodiment, the cap plate includes a second protruding portion extending outward in a radial direction from a lower portion of the cylindrical body.

According to at least one example embodiment, the cap plate includes a base interposed between a lower portion of the boat and the door plate, and the cylindrical body extends in the vertical direction from the base.

According to at least one example embodiment, the wafer processing apparatus further includes a flange connected to the lower portion of the reaction tube, wherein the door plate is connected to the flange to seal the reaction tube.

According to at least one example embodiment, the cap plate is arranged between an inner surface of the flange and the lower side surface of the boat.

According to at least one example embodiment, the exhaust portion includes an exhaust port that is connected to a space between an inner surface of the flange and an outer surface of the cap plate.

According to at least one example embodiment, the at least one first nozzle penetrates through the flange to extend into the guiding recess of the cap plate.

According to at least one example embodiment, the at least one first nozzle is configured to spray the first gas to the guiding recess of the cap plate.

According to at least one example embodiment, the at least one first nozzle has at least two ejection holes which eject the first gas in different directions, respectively.

According to at least one example embodiment, the at least one first nozzle has an ejection hole of a diffused shape.

According to at least one example embodiment, the cap plate includes one of quartz and metal.

According to at least one example embodiment, the at least one first nozzle includes one of quartz and metal.

According to at least one example embodiment, the wafer processing apparatus includes at least one second nozzle arranged in the reaction tube and configured to supply a second gas on the wafers, the second gas being a reaction gas.

According to at least one example embodiment, the boat is rotatable in the reaction tube.

According to at least one example embodiment, a wafer processing apparatus includes a reaction tube including a reaction chamber, a flange connectable to a lower portion of the reaction tube, a door plate connectable to the flange to seal the reaction chamber, and a wafer boat configured to support a plurality of wafers. The wafer boat may be insertable into the reaction chamber. The wafer apparatus further includes a cap plate on the door plate. The cap plate may include at least one protruding portion insertable between a side surface of a lower portion of the wafer boat and a side surface of the flange, the cap plate and the side surface of the flange forming an exhaust passage for a first gas.

According to at least one example embodiment, the at least one protruding portion includes a first protruding portion extending outward in a radial direction from an upper portion of the cap plate, the exhaust passage being formed by a circumferential space below the first protruding portion.

According to at least one example embodiment, at least one protruding portion includes a second protruding portion extending outward in a radial direction from a lower portion of the cap plate.

According to at least one example embodiment, the at least one protruding portion includes at least one concave portion, the at least one concave portion being configured to receive a nozzle through which a second gas is ejected into the reaction chamber.

According to at least one example embodiment, a distance between an end of the at least one protruding portion and at least one of the side surface of the flange and a side surface of the reaction tube ranges from about 1 mm to about 3 mm.

BRIEF DESCRIPTION OF THE DRAWINGS

Example embodiments will be more clearly understood from the following detailed description taken in conjunction with the accompanying drawings.

FIG. 1 is a cross-sectional view illustrating a wafer processing apparatus in accordance with at least one example embodiment.

FIG. 2 is a cross-sectional view illustrating a lower portion of a reaction tube of the wafer processing apparatus in FIG. 1.

FIG. 3 is a plan view illustrating a cap plate of the wafer processing apparatus in FIG. 1.

FIG. 4 is a perspective view illustrating the cap plate in FIG. 3.

FIG. 5 is a cross-sectional view illustrating a wafer processing apparatus in accordance with at least one example embodiment.

FIG. 6 is a perspective view illustrating a cap plate of the wafer processing apparatus in FIG. 5.

DETAILED DESCRIPTION OF EXAMPLE EMBODIMENTS

Figure 1:
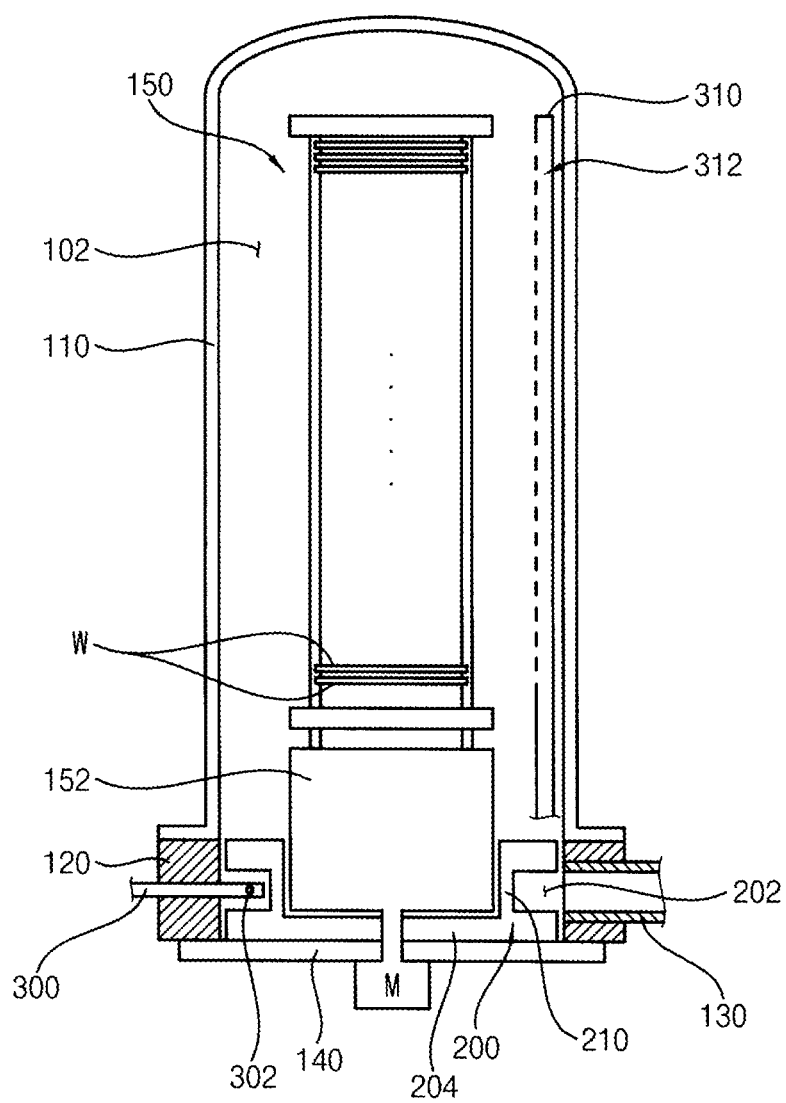
FIGS. 1 to 6 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
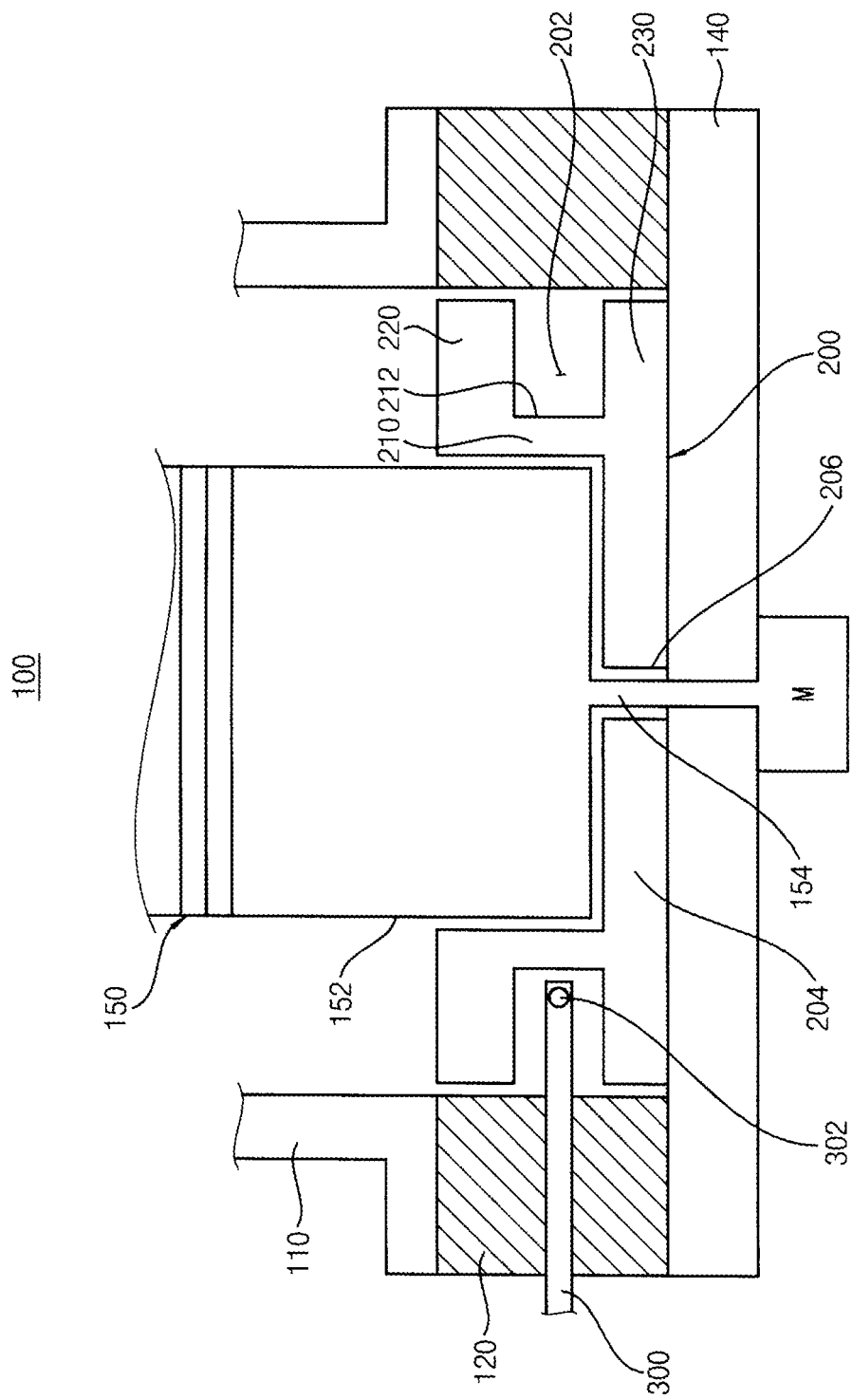
Figure 3:
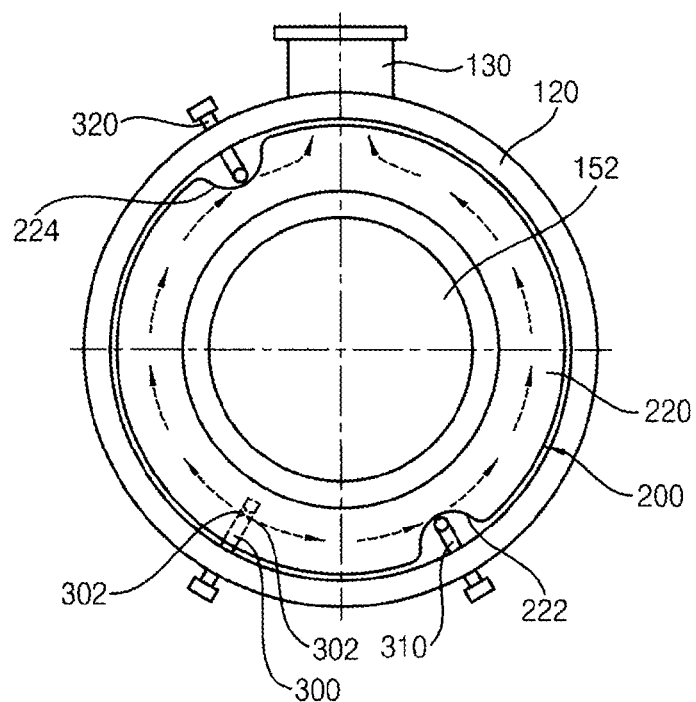
Figure 4:
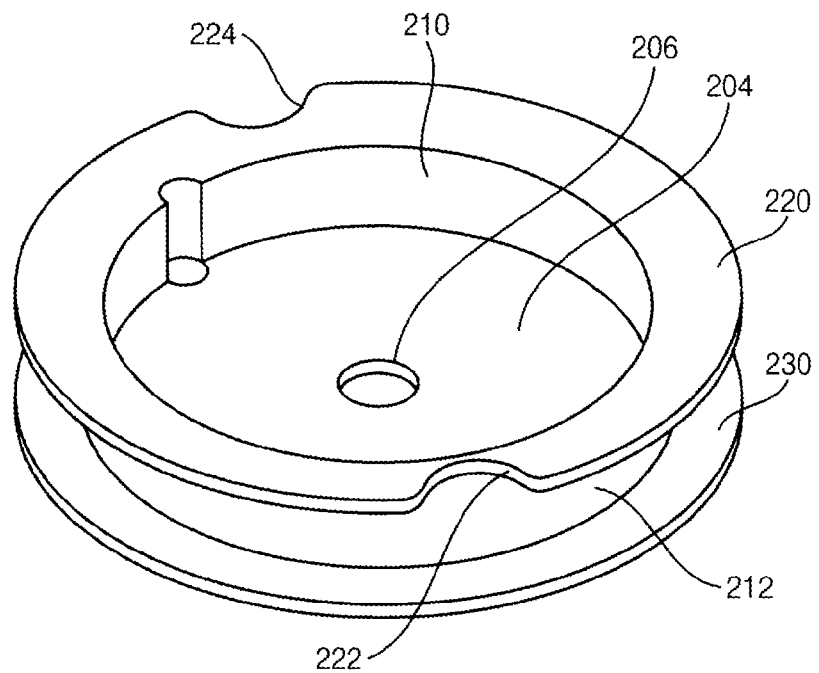

FIG. 1 is a cross-sectional view illustrating a wafer processing apparatus in accordance with at least one example embodiment. FIG. 2 is a cross-sectional view illustrating a lower portion of a reaction tube of the wafer processing apparatus in FIG. 1. FIG. 3 is a plan view illustrating a cap plate of the wafer processing apparatus in FIG. 1. FIG. 4 is a perspective view illustrating the cap plate in FIG. 3.

Referring to FIGS. 1 to 4, a wafer processing apparatus 100 may include a reaction tube 110 extending in a vertical direction, a door plate 140 for loading a boat 150 into the reaction tube 110, a cap plate 200 disposed on the door plate 140 and surrounding a lower portion of the boat 150, at least one nozzle 300 provided in a lower portion of the reaction tube 110 to supply a gas into the reaction tube 110, and an exhaust portion for exhausting a gas from the reaction tube 110.

In at least one example embodiment, the wafer processing apparatus 100 may include a vertical batch reactor. The reaction tube 110 may have a cylinder shape with a lower open end. The reaction tube 110 may extend in the vertical direction to define a reaction chamber 102 where a plurality of wafers W is processed. The vertical batch reactor may receive the boat 150 that holds a plurality of the wafers W therein. The batch reactor may allow for efficient heating and loading sequences.

A lower portion of the reactive tube 110 may include an open end, and an upper portion of the reactive tube 110 may include a closed end. Although it is not illustrated in the figures, a liner tube may be installed in the reaction tube 110. The liner tube may include an upper open end a lower open end to define the reaction chamber 102. The reaction chamber 102 may be maintained at a desired temperature by a temperature control system such as a heater (not illustrated) that surrounds the reaction tube 110.

The lower open end of the reaction tube 110 may be installed in a flange 120. The flange 120 may be also referred to as an inlet flange through which a nozzle penetrates to supply a gas to the reaction chamber 102. For example, the flange 120 may be combined with the lower portion of the reaction tube 110 by a sealing member such as O-ring to seal the reaction tube 110. Alternatively, the flange 120 may be formed integrally with the reaction tube 110.

The reaction chamber 102 may receive the boat 150 that holds a plurality of the wafers W that are spaced apart in the vertical direction. The boat 150 may be supported on the door plate 140. The door plate 140 may move upward and downward to load and unload the boat 150 into and from the reaction tube 110. A boat cap 152 may be disposed in the lower portion of the boat 150 to support the boat 150 and serve as a heat dissipation plate. For example, at least 25 to 150 wafers W may be stacked in the boat 150.

The door plate 140 may be positioned under the reaction tube 110 to seal the reaction tube 110. The door plate 140 may be combined with the flange 120 under the reaction tube 110 by a sealing member such as O-ring to seal the reaction tube 110.

In at least one example embodiment, the cap plate 200 may be positioned on the door plate 140 and surround the boat cap 152 in the lower portion of the boat 150. The cap plate 200 may be interposed between the door plate 140 and the lower portion of the boat 150 to receive the boat cap 152. The cap plate 200 may be arranged to face an inner surface of the flange 120. For example, the cap plate 200 may include quartz, stainless steel, metal alloy, etc.

As shown in FIG. 2, for example, the cap plate 200 may include a cylindrical body 210 surrounding a side surface of the lower portion of the boat 150, a first protruding portion 220 extending outward in a radial direction from an upper portion of the body 210. The cap plate 200 may include a second protruding portion 230 extending outward in a radial direction from a lower portion of the body 210.

The first and second protruding portions 220 and 230 may be spaced apart from an inner surface of the flange 120 by a desired (or alternatively, predetermined) distance such that the boat 150 may move upward and downward within the flange 120. Further, the first and second protruding portions 220 and 230 may be spaced apart from an inner surface of the flange 120 such that the cap plate 200 may inhibit (or alternatively, prevent) process gases and/or by-products in the reaction tube 110 from flowing into a space between the flange 120 and the cap plate 200. For example, the spacing distance between the inner surface of the flange 120 and the protruding portions 220 and 230 of the cap plate 200 may range from about 1 mm to about 3 mm.

The cap plate 200 may further include a base 204 interposed between the lower portion of the boat 150 and the door plate 140. The base 204 may be spaced apart from a lower surface of the boat cap 152 by a desired (or alternatively, predetermined) distance. For example, the spacing distance between the lower surface of the boat cap 152 and the base 204 may range from about 3 cm to about 5 cm.

The height of the cap plate 200 may be determined based on a size and shape of the vertical batch reactor, a process to be performed on the wafers, etc. For example, the cap plate 200 may have a height substantially the same as a height of the flange 120 such that the cap plate 200 may cover the inner surface of the flange 120. Alternatively, the cap plate 200 may have a height greater than or less than a height of the flange 120.

A through hole 206 may be formed in the base 204. A rotational shaft 154 of a motor (M) on an outer surface of the door plate 140 may penetrate the through hole 206 to be connected to the lower portion of the boat 150. Accordingly, the boat 150 on the door plate 140 may be rotatable in the reaction tube 110. While the boat 150 is rotated at a desired speed, reaction gases may be introduced on the wafers W to perform a deposition process.

The cylindrical body 210 may extend in a vertical direction from the base 204 to cover a lower side surface of the boat 150. A guiding recess 212 may be provided in an outer surface of the cylindrical body 210 along a circumferential direction of the cylindrical body 210. The guiding recess 212 may be defined by the first protruding portion 220 and the second protruding portion 230. Alternatively or additionally, a groove (not illustrated) may be further formed along the circumferential direction to extend in a depth direction from the outer surface of the cylindrical body 210. The groove may extend in the circumferential direction to be connected to the guiding recess 212.

The outer surface of the cylindrical body 210 may be arranged to face the inner surface of the flange 120. Accordingly, as discussed below, an exhaust passage 202 may be provided between the guiding recess 212 of the body 210 and the inner surface of the flange 120.

At least one nozzle 300 may be provided in the lower portion of the reaction tube 110 to supply a gas in the reaction tube 110. The nozzle 300 may penetrate through the flange 120 to extend into the guiding recess 212 of the cap plate 200. For example, the nozzle 300 may include quartz, stainless steel, metal alloy, etc.

Although it is not illustrated in the figure, the nozzle 300 may be connected to a cleaning gas source to supply a cleaning gas into the lower portion of the reaction tube 110. Alternatively, the nozzle 300 may be connected to a purge gas source to supply a purge gas into the reaction tube 110. For example, the cleaning gas may include HF, $F_2$, $NF_3$, $ClF_2$, etc. The purge gas may include $NH_3$.

As shown in FIG. 1, for example, the exhaust portion may include an exhaust port 130 that penetrates through the flange 120. The exhaust port 130 may be connected to a space between the inner surface of the flange 120 and the outer surface of the cap plate 200. For example, the exhaust port 130 may be connected to the exhaust passage 202 between the inner surface of the flange 120 and the guiding recess 212 of the body 210.

As illustrated in FIG. 3, the nozzle 300 may have at least two ejection holes 302 which are opened in different directions, respectively. For example, two ejection holes 302 may be opened in opposing directions. The ejection hole 302 may have a diffused shape.

Accordingly, gases sprayed from the ejection holes 302 of the nozzle 300 may flow in different directions along the guiding recess 212 on the outer surface of the cap plate 200 to be exhausted from the reaction tube 110 via the exhaust port 130. Although one nozzle 300 is illustrated in FIG. 3, a plurality of the nozzles may be arranged in the guiding recess 212 on the outer surface of the cap plate 200.

As illustrated in FIGS. 3 and 4, the wafer processing apparatus 100 may include gas nozzles 310 and 320 for supplying reaction gases onto the wafers W in the reaction tube 110. The gas nozzles 310 and 320 may penetrate through the flange 120 in the lower portion of the reaction tube 110 and extend in the vertical direction of the reaction tube 120 via the guiding recess 212 of the cap plate 200. Concave portions 222 and 224 may be provided in the first protruding portion 220, and the gas nozzles 310 and 320 may extend through the concave portions 222 and 224 in the vertical direction of the reaction tube 110.

The gas nozzles 310 and 320 may be arranged in the reaction tube 110 to be spaced apart from each other in the circumferential direction of the reaction tube 110. The gas nozzles 310 and 320 may form a central angle with the vertex located on the center of the reaction tube 110.

The gas nozzles 310 and 320 may be arranged adjacent to an inner surface of the reaction tube 110. The gas nozzle 310 may have a plurality of ejection holes 312 along an extending direction of the gas nozzle 310. For example, the gas nozzle may have a diameter of from about 1 mm to about 3 mm. The ejection holes may be spaced apart from one another by a desired (or alternatively, predetermined) distance along the extending direction of the gas nozzle. It will be appreciated that the diameters of the gas nozzle and the ejection hole, and the distance between the ejection holes may be selected based on a material of a layer to be deposited, a recipe of the deposition process, etc.

The reaction gases from the gas nozzles 310 and 320 may be pulsed sequentially or simultaneously into the reaction chamber 102. Alternatively, one of the reaction gases may be supplied at a desired (or alternatively, predetermined) flow rate (e.g., a constant flow rate) and another of the first and second reaction gases may be pulsed into the reaction chamber 102. The reaction chamber may be maintained at a temperature of from about 0° C. to about 800° C. when the reaction gases, the pulse gas, and the cleaning gas are supplied into the reaction chamber 102. It will be understood that various methods for supplying the reaction gases, the pulse gas, and the cleaning gas may be selected in order to deposit a target layer having a uniform thickness.

As mentioned above, after the cleaning gas is supplied into the lower portion of the reaction tube 110, the cleaning gas may flow along the guiding recess 212 on the outer surface of the cap plate 200 between the inner surface of the flange 120 and the outer surface of the body 210 of the cap plate 200. The cleaning gas may then be exhausted through the exhaust port 130 from the reaction tube 110. Accordingly, an undesired material layer may be inhibited (or alternatively, prevented) from being deposited excessively on the lower portion of the reaction tube 110.

Figure 5:
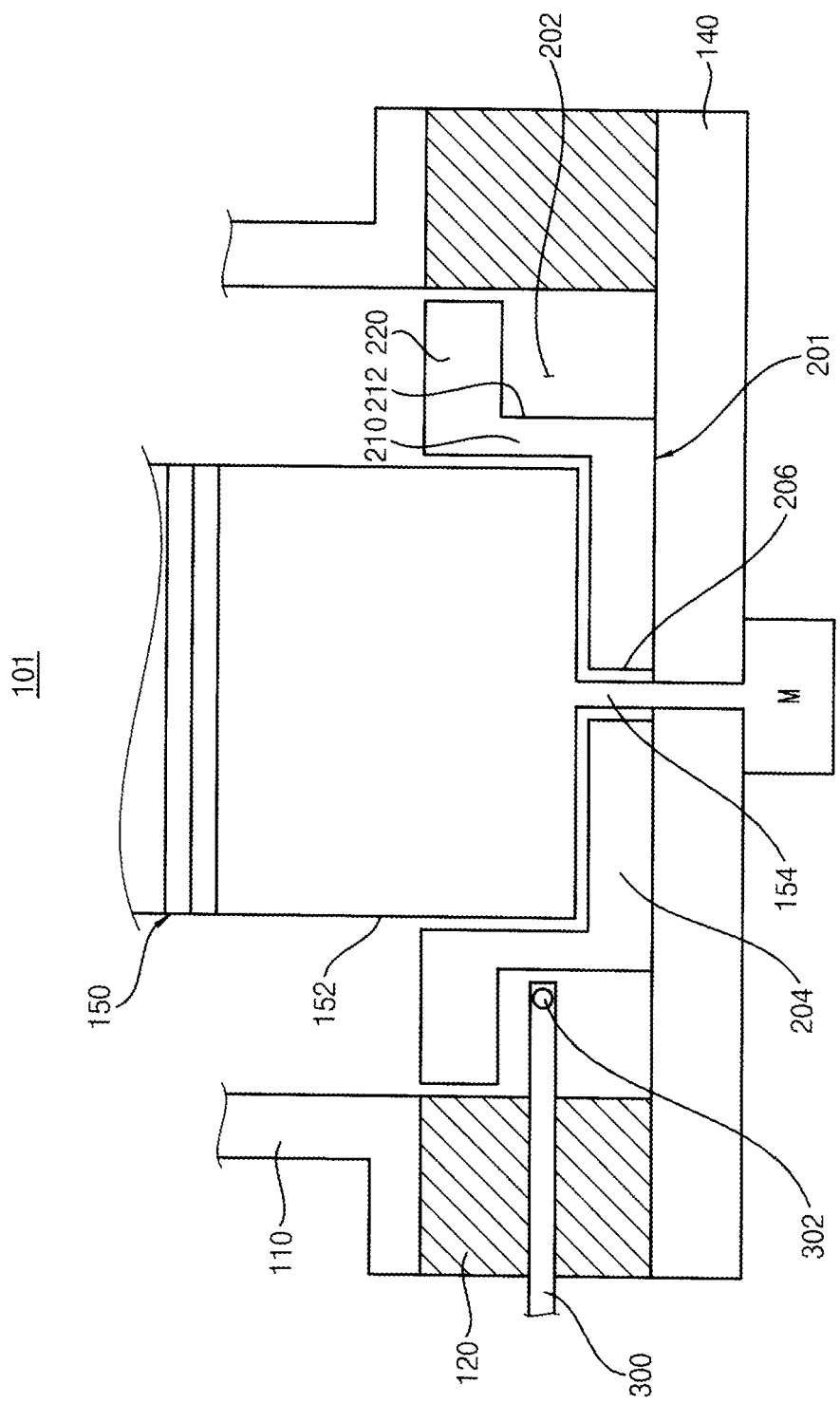
Figure 6:
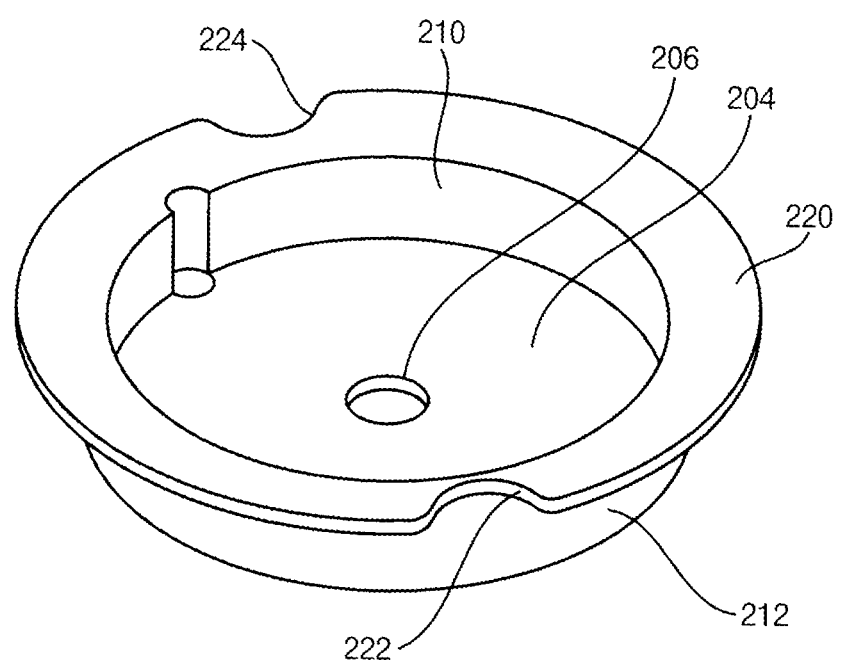

FIG. 5 is a cross-sectional view illustrating a wafer processing apparatus in accordance with at least one example embodiment. FIG. 6 is a perspective view illustrating a cap plate of the wafer processing apparatus in FIG. 5. The wafer processing apparatus may be substantially the same as or similar to the apparatus described with reference to FIGS. 1 to 4, except for a structure of a cap plate. Thus, same reference numerals will be used to refer to the same or like elements as those described in the apparatus described with reference to FIGS. 1 to 4, and any further repetitive explanation concerning the above elements will be omitted.

Referring to FIGS. 5 and 6, a wafer processing apparatus 101 may include a reaction tube 110 extending in a vertical direction, a door plate 140 for loading a boat 150 into the reaction tube 110, and a cap plate 201 disposed on the door plate 140 and surrounding a lower portion of the boat 150. The wafer processing apparatus 101 may also include at least one nozzle 300 provided in a lower portion of the reaction tube 110 to supply a gas into the reaction tube 110, and an exhaust portion for exhausting a gas from the reaction tube 110.

In at least one example embodiment, the cap plate 201 may be positioned on the door plate 140 and surround the boat cap 152 in the lower portion of the boat 150. The cap plate 201 may be interposed between the door plate 140 and the lower portion of the boat 150 to receive the boat cap 152. The cap plate 201 may be arranged to face an inner surface of the flange 120.

The cap plate 201 may include a cylindrical body 210 surrounding a side surface of the lower portion of the boat 150 and a first protruding portion 220 extending outward in a radial direction from an upper portion of the body 210. The cap plate 201 may further include a base 204 interposed between the lower portion of the boat 150 and the door plate 140.

The first protruding portion 220 may be spaced apart from an inner surface of the flange 120 by a desired (or alternatively, predetermined) distance such that the boat 150 may move upward and downward within the flange 120. Accordingly, the first protruding portion 220 of the cap plate 200 may inhibit (or alternatively, prevent) process gases and/or by-products in the reaction tube 110 from flowing into a space between the flange 120 and the cap plate 201.

The cylindrical body 210 may extend in the vertical direction from the base 204 to cover a lower side surface of the boat 150. A guiding recess 212 may be provided in an outer surface of the cylindrical body 210 along a circumferential direction of the cylindrical body 210. The guiding recess 212 may be defined by the first protruding portion 220. Alternatively or additionally, the guiding recess 212 may be a groove formed along the circumferential direction to extend in a depth direction from the outer surface of the cylindrical body 210.

The outer surface of the cylindrical body 210 may be arranged to face the inner surface of the flange 120. Accordingly, an exhaust passage 202 may be provided between the guiding recess 212 of the body 210 and the inner surface of the flange 120.

A nozzle 300 may penetrate through the flange 120 in the lower portion of the reaction tube 110 to extend into the guiding recess 212 of the cap plate 201. An exhaust port 130 may be connected to the exhaust passage 202 between the inner surface of the flange 120 and the guiding recess 212 of the body 210.

Accordingly, gases sprayed from ejection holes 302 of the nozzle 300 may flow bi-directionally along the guiding recess 212 on the outer surface of the cap plate 200 to be exhausted from the reaction tube 110 via the exhaust port 130. Accordingly, a material layer may be inhibited (or alternatively, prevented) from being deposited excessively on the lower portion of the reaction tube 110 to thereby reduce (or alternatively, optimize) times for equipment repair and maintenance.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of inventive concepts. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A wafer processing apparatus, comprising:
a reaction tube extending in a vertical direction;
a door plate under the reaction tube to seal the reaction tube, the door plate configured to load a boat into the reaction tube and support a plurality of wafers;
a cap plate on the door plate, the cap plate including a cylindrical body, a guiding recess and a first protruding portion, the first protruding portion and the cylindrical portion forming one body, the cap plate is not rotatable, the cylindrical body configured to surround a lower side surface of the boat, the guiding recess in an outer surface of the cylindrical body along a circumferential direction of the cylindrical body, the first protruding portion configured to be inserted between a side surface of a lower portion of the boat and a side surface of a flange;
at least one first nozzle in a lower portion of the reaction tube, the at least one first nozzle configured to supply a first gas in the reaction tube, the at least one first nozzle having at least one distal end portion, the at least one distal end portion penetrates through the flange to extend into the guiding recess of the cap plate; and
an exhaust portion configured to remove the first gas from the reaction tube through the guiding recess.

2. The wafer processing apparatus of claim 1, wherein the cap plate includes a second protruding portion extending outward in a radial direction from an upper portion of the cylindrical body.

3. The wafer processing apparatus of claim 2, wherein the cap plate includes a third protruding portion extending outward in a radial direction from a lower portion of the cylindrical body.

4. The wafer processing apparatus of claim 1, wherein,
the cap plate includes a base interposed between a lower portion of the boat and the door plate, and
the cylindrical body extends in the vertical direction from the base.

5. The wafer processing apparatus of claim 1, wherein the flange is connected to the lower portion of the reaction tube, and the door plate is connected to the flange to seal the reaction tube.

6. The wafer processing apparatus of claim 5, wherein the cap plate is arranged between an inner surface of the flange and the lower side surface of the boat.

7. The wafer processing apparatus of claim 5, wherein the exhaust portion includes an exhaust port that is connected to a space between an inner surface of the flange and an outer surface of the cap plate.

8. The wafer processing apparatus of claim 1, wherein the at least one first nozzle is configured to spray the first gas to the guiding recess of the cap plate.

9. The wafer processing apparatus of claim 1, wherein the at least one first nozzle has at least two ejection holes which eject the first gas in different directions, respectively.

10. The wafer processing apparatus of claim 1, wherein the at least one first nozzle has an ejection hole.

11. The wafer processing apparatus of claim 1, wherein the cap plate includes one of quartz and metal.

12. The wafer processing apparatus of claim 1, wherein the at least one first nozzle includes one of quartz and metal.

13. The wafer processing apparatus of claim 1, further comprising:
at least one second nozzle arranged in the reaction tube and configured to supply a second gas on the wafers, the second gas being a reaction gas.

14. The wafer processing apparatus of claim 1, wherein the boat is rotatable in the reaction tube.

15. A wafer processing apparatus, comprising:
a reaction tube including a reaction chamber;
a flange connectable to a lower portion of the reaction tube;
a door plate connectable to the flange to seal the reaction chamber;
a wafer boat configured to support a plurality of wafers, the wafer boat configured to be inserted into the reaction chamber;
a cap plate on the door plate, the cap plate including a cylindrical body, a guiding recess and at least one protruding portion insertable between a side surface of a lower portion of the wafer boat and a side surface of the flange, the cap plate and the side surface of the flange forming an exhaust passage for a first gas, the cylindrical body and one of the at least one protruding portion form one body, the cap plate is not rotatable;
at least one first nozzle in a lower portion of the reaction tube, at least one first nozzle configured to supply the first gas in the reaction tube, the at least one first nozzle having at least one distal end portion, the at least one distal end portion penetrates through the flange to extend into the guiding recess of the cap plate.

16. The wafer processing apparatus of claim 15, wherein the at least one protruding portion includes a first protruding portion extending outward in a radial direction from an upper portion of the cap plate, the exhaust passage being formed by a circumferential space below the first protruding portion.

17. The wafer processing apparatus of claim 16, wherein the at least one protruding portion includes a second protruding portion extending outward in a radial direction from a lower portion of the cap plate.

18. The wafer processing apparatus of claim 15, wherein the at least one protruding portion includes at least one concave portion, the at least one concave portion being configured to receive at least one second nozzle through which a second gas is ejected into the reaction chamber.

19. The wafer processing apparatus of claim 15, wherein a distance between an end of the at least one protruding portion and at least one of the side surface of the flange and a side surface of the reaction tube ranges from about 1 mm to about 3 mm.

* * * * *